(12) United States Patent
Storm et al.

(10) Patent No.: US 12,381,062 B2
(45) Date of Patent: Aug. 5, 2025

(54) TOOL FOR TESTING AN ELECTRON-OPTICAL ASSEMBLY

(71) Applicant: ASML Netherlands B.V., Veldhoven (NL)

(72) Inventors: Arjen Benjamin Storm, Delft (NL); Johan Frederik Cornelis Van Gurp, Berkel en Rodenrijs (NL); Henri Kristian Ervasti, The Hague (NL); Aaron Yang-Fay Ayal, Roosendaal (NL); Stijn Wilem Herman Karel Steenbrink, The Hague (NL); Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 236 days.

(21) Appl. No.: 17/891,913

(22) Filed: Aug. 19, 2022

(65) Prior Publication Data
US 2022/0392729 A1  Dec. 8, 2022

Related U.S. Application Data

(63) Continuation of application No. PCT/EP2021/053190, filed on Feb. 10, 2021.

(51) Int. Cl.
*H01J 9/42* (2006.01)
*H01J 37/244* (2006.01)

(52) U.S. Cl.
CPC .............. *H01J 9/42* (2013.01); *H01J 37/244* (2013.01); *H01J 2237/2443* (2013.01); *H01J 2237/2445* (2013.01); *H01J 2237/24514* (2013.01)

(58) Field of Classification Search
None
See application file for complete search history.

(56) References Cited

U.S. PATENT DOCUMENTS

| | | | |
|---|---|---|---|
| 6,552,340 B1 * | 4/2003 | Krivanek | H01J 37/21 850/10 |
| 2003/0132382 A1 | 7/2003 | Sogard | |
| 2010/0038554 A1 | 2/2010 | Platzgummer et al. | |
| 2013/0297061 A1 | 11/2013 | Tsai et al. | |
| 2017/0098525 A1 | 4/2017 | Flitsch | |
| 2019/0371566 A1 * | 12/2019 | Sears | H01J 37/21 |

FOREIGN PATENT DOCUMENTS

JP  H03160391 A1  7/1991

OTHER PUBLICATIONS

International Search Report received from the International Search Authority issued in related International Application No. PCT/EP2021/053190 mailed May 4, 2021 (2 pgs.).

* cited by examiner

*Primary Examiner* — Edwin C Gunberg
(74) *Attorney, Agent, or Firm* — Finnegan, Henderson, Farabow, Garrett & Dunner, LLP

(57) ABSTRACT

Disclosed herein is an electron-optical assembly testing system for testing an electron-optical assembly, the system comprising: a source of charged particles configured to emit a beam of charged particles; an electron-optical assembly holder configured to hold an electron-optical assembly to be tested such that, when the system is in use with an electron-optical assembly held by the electron-optical assembly holder, the electron-optical assembly is illuminated by the beam; and a sub-beam detector for detecting sub-beams of charged particles that have been transmitted through the electron-optical assembly.

20 Claims, 9 Drawing Sheets

TOOL FOR TESTING AN ELECTRON-OPTICAL ASSEMBLY

CROSS-REFERENCE TO RELATED APPLICATIONS

This application claims priority of International application PCT/EP2021/053190, filed on 10 Feb. 2021, which claims priority of EP application 20158588.2, which was filed on 20 Feb. 2020, all of which are incorporated herein by reference in their entireties.

FIELD

The embodiments provided herein generally relate to a tool for testing an electron-optical assembly. An electron-optical assembly is configured to manipulate one or more beams of charged particles, such as by deflecting and/or focusing the beams of charged particles. Embodiments provide a tool for testing the performance of an electron-optical assembly. The tool according to embodiments may be used to test the performance of an electron-optical assembly at a number of stages during the manufacture of the electron-optical assembly and/or after the complete manufacture of an electron-optical device comprising the electron-optical assembly.

BACKGROUND

When manufacturing semiconductor integrated circuit (IC) chips, undesired pattern defects, as a consequence of, for example, optical effects and incidental particles, inevitably occur on a substrate (i.e., wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

Another application for a charged particle beam is lithography. The charged particle beam reacts with a resist layer on the surface of a substrate. A desired pattern in the resist can be created by controlling the locations on the resist layer that the charged particle beam is directed towards.

A charged particle apparatus may be an apparatus for generating, illuminating, projecting and/or detecting one or more beams of charged particles. Within a charged particle apparatus, one or more electron-optical devices are provided for manipulating one or more beams of charged particles. An electron-optical device comprises an electron-optical assembly as well as the necessary supporting structures of the electron-optical assembly, such as structural supports and the electrical connections to the electron-optical assembly. The electron-optical assembly comprises the components for manipulating the one or more beams of charged particles.

SUMMARY

The embodiments provided herein disclose a tool that is a system for testing the performance of an electron-optical assembly. The electron-optical assembly comprises components for manipulating a multi-beam of charged particles. The tool may be used to test the performance of the electron-optical assembly and/or an electron-optical device comprising the electron-optical assembly. An electron-optical device comprising the electron-optical assembly may be used to manipulate one or more beams of charged particles in a charged particle apparatus.

According to some embodiments of the present disclosure, there is provided an electron-optical assembly testing system for testing an electron-optical assembly, the system comprising: a source of charged particles configured to emit a beam of charged particles; an electron-optical assembly holder configured to hold an electron-optical assembly to be tested such that, when the system is in use with an electron-optical assembly held by the electron-optical assembly holder, the electron-optical assembly is illuminated by the beam; and a sub-beam detector for detecting sub-beams of charged particles that have been transmitted through the electron-optical assembly.

According to some embodiments of the present disclosure, there is provided a method of testing an electron-optical assembly, the method comprising: illuminating the electron-optical assembly with at least one beam of charged particles such that charged particles in the at least one beam are transmitted through the electron-optical assembly in a plurality of sub-beams; detecting sub-beams of charged particles that have been transmitted through the electron-optical assembly; and determining the performance of the electron-optical assembly in dependence on the detected sub-beams; wherein the test of the determination of the performance of the electron-optical assembly is made prior to use of an electron-optical device, that comprises the electron-optical assembly, in a charged particle apparatus for SEM or lithography.

According to some embodiments of the present disclosure, there is provided a method of manufacturing an electron-optical device that comprises an electron-optical assembly, the method comprising: testing an electron-optical assembly according to the method of the second aspect; and determining to construct an electron-optical device that comprises the electron-optical assembly in dependence on the test.

According to some embodiments of the present disclosure, there is provided an electron-optical assembly testing system for testing an electron-optical assembly, the system comprising: a source of charged particles configured to emit a beam of charged particles; an electron-optical assembly holder configured to hold an electron-optical assembly for testing the electron-optical assembly by transmission of charged particle beams from the source through the electron-optical assembly; and a sub-beam detector configured to detect sub-beams of charged particles transmitted from the source through the electron-optical assembly held by the holder.

According to known techniques, the performance of an electron-optical assembly can only be determined when the electron-optical assembly is comprised by an electron-optical device that is installed in the charged particle apparatus that it is to be used in. Testing of such an electron-optical assembly therefore occurs in the charged particle apparatus, whether it is an electron-beam tool for inspection or lithography, or an operable module of the tool (e.g., an electron-optical system). Such testing can be expensive because the manufacture of such an electron-optical device may comprise completely constructing an electron-optical device, which may comprise an electron-optical assembly and a PCB, and installing the electron-optical device in a charged particle apparatus so that it can be tested. Such a charged particle apparatus could include several such electron-optical devices which may be of different designs. Installing each electron-optical devices in the charged particle apparatus may require preparation of the vacuum in the charged particle apparatus, which is time consuming. In addition, it may not be possible to determine the performance of an electron-optical device on its own. It may only be possible to determine the performance of the electron-optical device together with the performance of other devices that influence charged particles in the charged particle apparatus.

Advantageously, the tool according to embodiments allows the performance of only an electron-optical assembly to be determined. In addition, the performance of an electron-optical assembly may be determined at a number of stages during the manufacture of the electron-optical assembly and/or after the complete manufacture of the electron-optical assembly. Any potential problems with the performance of the electron-optical assembly can therefore be determined quickly. A failure of an electron-optical assembly can be quickly determined and the assembly can be removed from electron-optical device production process. The tool may also be used to determine the performance of an electron-optical device that comprises the electron-optical assembly.

Furthermore, when testing the electron-optical assembly, the tool can illuminate the electron-optical assembly with charged particles that have a lower power than the required power of charged particles when a charged particle apparatus is used for inspection (e.g., SEM) or lithography. It is therefore easier for the tool according to embodiments to be used safely than a charged particle apparatus for SEM or lithography.

Other advantages of the disclosed embodiments will become apparent from the following description taken in conjunction with the accompanying drawings wherein are set forth, by way of illustration and example, certain embodiments of the present disclosure.

BRIEF DESCRIPTION OF FIGURES

The above and other aspects of the present disclosure will become more apparent from the description of exemplary embodiments, taken in conjunction with the accompanying drawings.

DETAILED DESCRIPTION OF FIGURES

Figure 1:
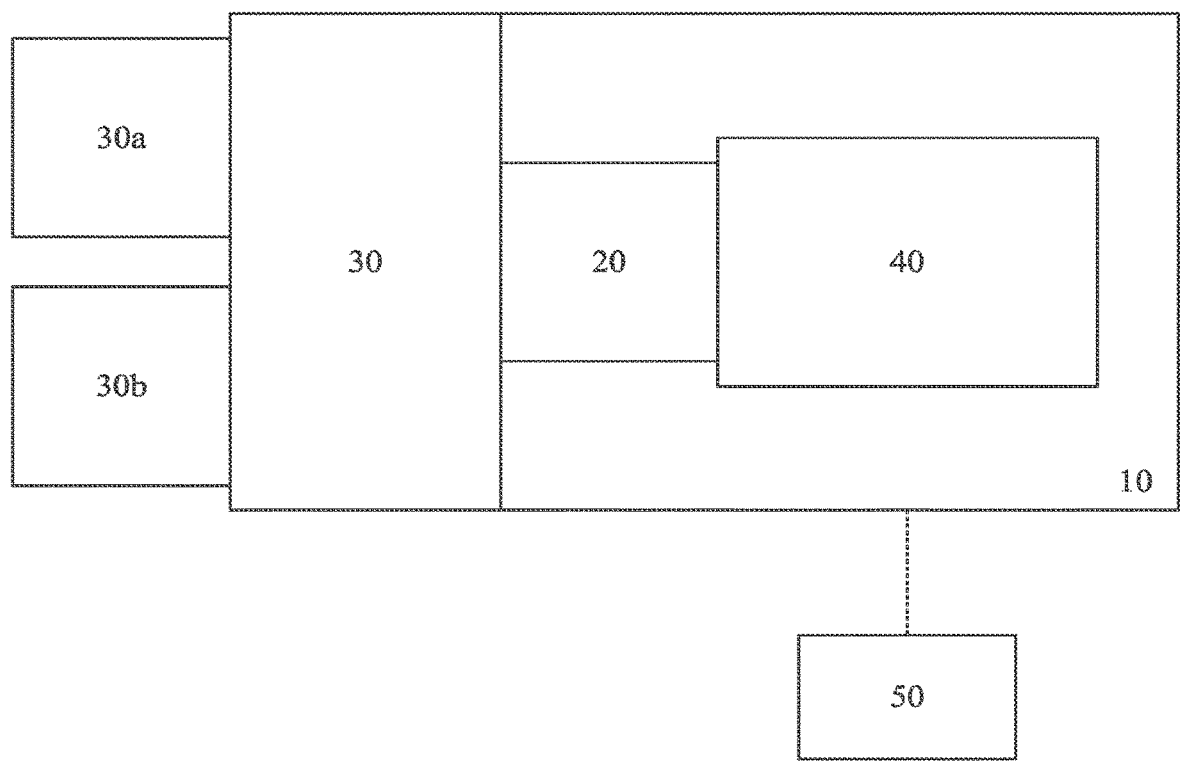
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than $1/1000$th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If an individual step has a yield of 95%, the overall process yield would be as low as 7%.

While high process yield is desirable in an IC chip manufacturing facility, maintaining a high substrate (i.e., wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a Scanning Electron Microscope (SEW)) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e., a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

In a multi-beam inspection apparatus, the paths of some of the primary electron beams are displaced away from the central axis, i.e., a mid-point of the primary electron optical axis, of the scanning device. To ensure all the electron beams arrive at the sample surface with substantially the same angle of incidence, sub-beam paths with a greater radial distance from the central axis need to be manipulated to move through a greater angle than the sub-beam paths with paths closer to the central axis. This stronger manipulation may cause aberrations which result in blurry and out-of-focus images of the sample substrate. In particular, for sub-beam paths that are not on the central axis, the aberrations in the sub-beams may increase with the radial displacement from the central axis. Such aberrations may remain associated with the secondary electrons when they are detected. Such aberrations therefore degrade the quality of images that are created during inspection.

An implementation of a known multi-beam inspection apparatus is described below.

The figures are schematic. Relative dimensions of components in drawings are therefore exaggerated for clarity. Within the following description of drawings, the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30a and a second loading port 30b. EFEM 30 may include additional loading port(s). First loading port 30a and second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise either a single beam or a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
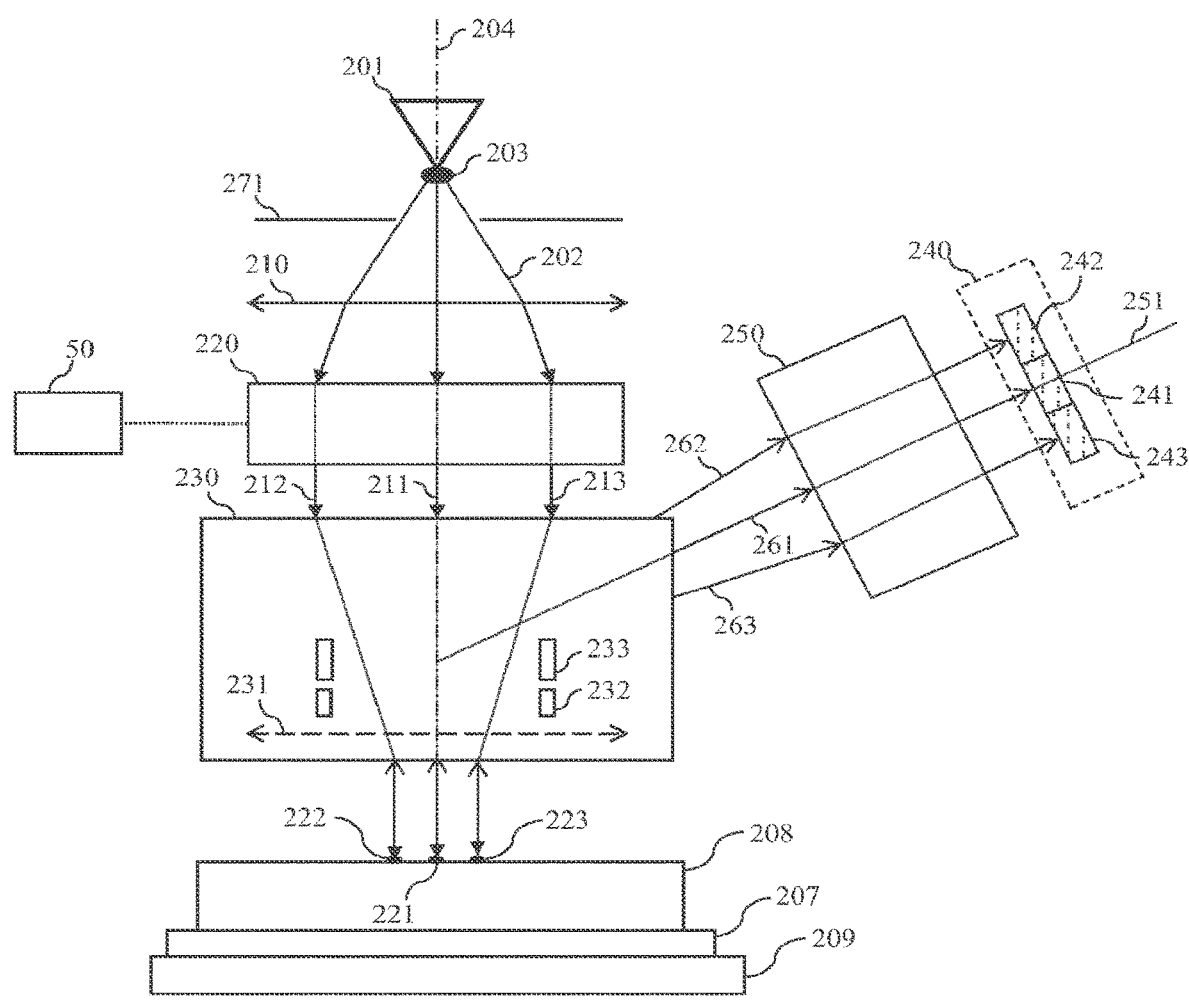
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a gun aperture plate 271, a condenser lens 210, a source conversion unit 220, a primary projection apparatus 230, a motorized stage 209, and a sample holder 207. The electron source 201, a gun aperture plate 271, a condenser lens 210, a source conversion unit 220 are the components of an illumination apparatus comprised by the multi-beam electron beam tool 40. The sample holder 207 is supported by motorized stage 209 so as to hold a sample 208 (e.g., a substrate or a mask) for inspection. Multi-beam electron beam tool 40 may further comprise a secondary projection apparatus 250 and an associated electron detection device 240. Primary projection apparatus 230 may comprise an objective lens 231. Electron detection device 240 may comprise a plurality of detection elements 241, 242, and 243. A beam separator 233 and a deflection scanning unit 232 may be positioned inside primary projection apparatus 230.

The components that are used to generate a primary beam may be aligned with a primary electron-optical axis of the apparatus 40. These components can include: the electron source 201, gun aperture plate 271, condenser lens 210, source conversion unit 220, beam separator 233, deflection scanning unit 232, and primary projection apparatus 230. Secondary projection apparatus 250 and its associated electron detection device 240 may be aligned with a secondary electron-optical axis 251 of apparatus 40.

The primary electron-optical axis 204 is comprised by the electron-optical axis of the of the part of electron beam tool 40 that is the illumination apparatus. The secondary electron-optical axis 251 is the electron-optical axis of the of the part of electron beam tool 40 that is a detection apparatus. The primary electron-optical axis 204 may also be referred to herein as the primary optical axis (to aid ease of reference) or charged particle optical axis. The secondary electron-optical axis 251 may also be referred to herein as the secondary optical axis or the secondary charged particle optical axis.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

In this arrangement a primary electron beam, by the time it reaches the sample, and preferably before it reaches the projection apparatus, is a multi-beam. Such a multi-beam can be generated from the primary electron beam in a number of different ways. For example, the multi-beam may be generated by a multi-beam array located before the cross-over, a multi-beam array located in the source conversion unit 220, or a multi-beam array located at any point in between these locations. A multi-beam array may comprise a plurality of electron beam manipulating elements arranged in an array across the beam path. Each manipulating element may influence the primary electron beam to generate a sub-beam. Thus the multi-beam array interacts with an incident primary beam path to generate a multi-beam path down-beam of the multi-beam array.

Gun aperture plate 271, in operation, is configured to block off peripheral electrons of primary electron beam 202 to reduce Coulomb effect. The Coulomb effect may enlarge the size of each of probe spots 221, 222, and 223 of primary sub-beams 211, 212, 213, and therefore deteriorate inspection resolution. A gun aperture plate 271 may also be referred to as a coulomb aperture array.

Condenser lens 210 is configured to focus primary electron beam 202. Condenser lens 210 may be designed to focus primary electron beam 202 to become a parallel beam and be normally incident onto source conversion unit 220. Condenser lens 210 may be a movable condenser lens that may be configured so that the position of its first principal plane is movable. The movable condenser lens may be configured to be magnetic. Condenser lens 210 may be an anti-rotation condenser lens and/or it may be movable.

Source conversion unit 220 may comprise an image-forming element array, an aberration compensator array, a beam-limit aperture array, and a pre-bending micro-deflector array. The pre-bending micro-deflector array may deflect a plurality of primary sub-beams 211, 212, 213 of primary electron beam 202 to normally enter the beam-limit aperture array, the image-forming element array, and an aberration compensator array. In this arrangement, the image-forming element array may function as a multi-beam array to generate the plurality of sub-beams in the multi-beam path, i.e., primary sub-beams 211, 212, 213. The image forming array may comprise a plurality electron beam manipulators such as micro-deflectors micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may comprise a field curvature compensator array (not shown) and an astigmatism compensator array (not shown). The field curvature compensator array may comprise a plurality of micro-lenses to compensate field curvature aberrations of the primary sub-beams 211, 212, and 213. The astigmatism compensator array may comprise a plurality of micro-stigmators to compensate astigmatism aberrations of the primary sub-beams 211, 212, and 213. The beam-limit aperture array may be configured to limit diameters of individual primary sub-beams 211, 212, and 213. FIG. 2 shows three primary sub-beams 211, 212, and 213 as an example, and it should be understood that source conversion unit 220 may be configured to form any number of primary sub-beams. Controller 50 may be connected to various parts of charged particle beam inspection apparatus 100 of FIG. 1, such as source conversion unit 220, electron detection device 240, primary projection apparatus 230, or motorized stage 209. As explained in further detail below, controller 50 may perform various image and signal processing functions. Controller 50 may also generate various control signals to govern operations of the charged particle beam inspection apparatus, including the charged particle multi-beam apparatus.

Condenser lens 210 may further be configured to adjust electric currents of primary sub-beams 211, 212, 213 down-beam of source conversion unit 220 by varying the focusing power of condenser lens 210. Alternatively, or additionally, the electric currents of the primary sub-beams 211, 212, 213 may be changed by altering the radial sizes of beam-limit apertures within the beam-limit aperture array corresponding to the individual primary sub-beams. The electric currents may be changed by both altering the radial sizes of beam-limit apertures and the focusing power of condenser lens 210. If the condenser lens is moveable and magnetic, off-axis sub-beams 212 and 213 may result that illuminate source conversion unit 220 with rotation angles. The rotation angles change with the focusing power or the position of the first principal plane of the movable condenser lens. A condenser lens 210 that is an anti-rotation condenser lens may be configured to keep the rotation angles unchanged while the focusing power of condenser lens 210 is changed. Such a condenser lens 210 that is also movable, may cause the rotation angles not change when the focusing power of the condenser lens 210 and the position of its first principal plane are varied.

Objective lens 231 may be configured to focus sub-beams 211, 212, and 213 onto a sample 208 for inspection and may form three probe spots 221, 222, and 223 on the surface of sample 208.

Beam separator 233 may be, for example, a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary sub-beams 211, 212, and 213. The electrostatic force is equal in magnitude but opposite in direction to the magnetic force exerted by magnetic dipole field of beam separator 233 on the individual electrons. Primary sub-beams 211, 212, and 213 may therefore pass at least substantially straight through beam separator 233 with at least substantially zero deflection angles.

Deflection scanning unit 232, in operation, is configured to deflect primary sub-beams 211, 212, and 213 to scan probe spots 221, 222, and 223 across individual scanning areas in a section of the surface of sample 208. In response to incidence of primary sub-beams 211, 212, and 213 or probe spots 221, 222, and 223 on sample 208, electrons are generated from the sample 208 which include secondary electrons and backscattered electrons. The secondary electrons propagate in three secondary electron beams 261, 262, and 263. The secondary electron beams 261, 262, and 263 typically have secondary electrons (having electron energy ≤50 eV) and may also have at least some of the backscattered electrons (having electron energy between 50 eV and the landing energy of primary sub-beams 211, 212, and 213). The beam separator 233 is arranged to deflect the path of the secondary electron beams 261, 262, and 263 towards the secondary projection apparatus 250. The secondary projection apparatus 250 subsequently focuses the path of secondary electron beams 261, 262, and 263 onto a plurality of detection regions 241, 242, and 243 of electron detection device 240. The detection regions may be the separate detection elements 241, 242, and 243 that are arranged to detect corresponding secondary electron beams 261, 262, and 263. The detection regions generate corresponding signals which are sent to controller 50 or a signal processing system (not shown), e.g., to construct images of the corresponding scanned areas of sample 208.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., controller 50). Each detection element 241, 242, and 243 may comprise one or more pixels. The intensity signal output of a detection element may be a sum of signals generated by all the pixels within the detection element.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Although FIG. 2 shows that apparatus 40 uses three primary electron sub-beams, it is appreciated that apparatus 40 may use two or more number of primary electron sub-beams. The present disclosure does not limit the number of primary electron beams used in apparatus 40.

Figure 3:
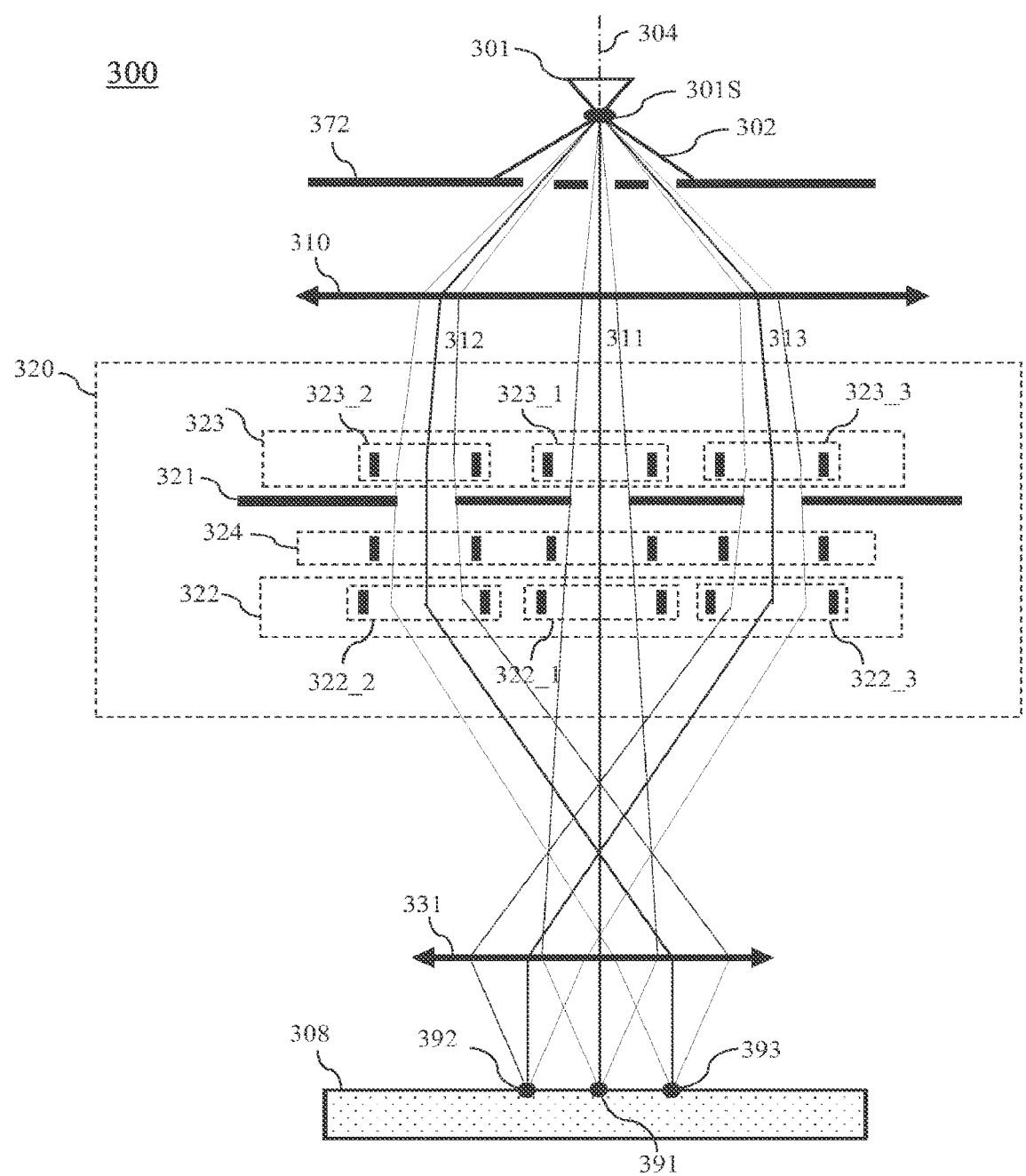
FIG. 3 is a schematic diagram of exemplary multi-beam apparatus illustrating an exemplary configuration of source conversion unit of the exemplary charged particle beam inspection apparatus of FIG. 1.

Reference is now made to FIG. 3, which is a schematic diagram of exemplary multi-beam apparatus illustrating an exemplary configuration of source conversion unit of the exemplary charged particle beam inspection apparatus of FIG. 1. The apparatus 300 may comprise an election source 301, a pre-sub-beam-forming aperture array 372, a condenser lens 310 (similar to condenser lens 210 of FIG. 2), a source conversion unit 320, an objective lens 331 (similar to objective lens 231 of FIG. 2), and a sample 308 (similar to sample 208 of FIG. 2). The election source 301, a pre-sub-beam-forming aperture array 372, a condenser lens 310 may be the components of an illumination apparatus comprised by the apparatus 300. The source conversion unit 320, an objective lens 331 may the components of a projection apparatus comprised by the apparatus 300. The source conversion unit 320 may be similar to source conversion unit 220 of FIG. 2 in which the image-forming element array of FIG. 2 is image-forming element array 322, the aberration compensator array of FIG. 2 is aberration compensator array 324, the beam-limit aperture array of FIG. 2 is beam-limit aperture array 321, and the pre-bending micro-deflector array of FIG. 2 is pre-bending micro-deflector array 323. The election source 301, the pre-sub-beam-forming aperture array 372, the condenser lens 310, the source conversion unit 320, and the objective lens 331 are aligned with a primary electron-optical axis 304 of the apparatus. The electron source 301 generates a primary-electron beam 302 generally along the primary electron-optical axis 304 and with a source crossover (virtual or real) 301S. The pre-sub-beam-forming aperture array 372 cuts the peripheral electrons of primary electron beam 302 to reduce a consequential Coulomb effect. The Coulomb effect is a source of aberration to the sub-beams due to interaction between electrons in different sub-beam paths. Primary-electron beam 302 may be trimmed into a specified number of sub-beams, such as three sub-beams 311, 312 and 313, by pre-sub-beam-forming aperture array 372 of a pre-sub-beam-forming mechanism. Although three sub-beams and their paths are referred to in the previous and following description, it should be understood that the description is intended to apply an apparatus, tool, or system with any number of sub-beams.

The source conversion unit 320 may include a beamlet-limit aperture array 321 with beam-limit apertures configured to limit the sub-beams 311, 312, and 313 of the primary electron beam 302. The source conversion unit 320 may also include an image-forming element array 322 with image-forming micro-deflectors, 322_1, 3222, and 322_3. There is a respective micro-deflector associated with the path of each sub-beam. The micro-deflectors 322_1, 3222, and 322_3 are configured to deflect the paths of the sub-beams 311, 312, and 313 towards the electron-optical axis 304. The deflected sub-beams 311, 312 and 313 form virtual images of source crossover 301S. The virtual images are projected onto the sample 308 by the objective lens 331 and form probe spots thereon, which are the three probe spots, 391, 392, and 393. Each probe spot corresponds to the location of incidence of a sub-beam path on the sample surface. The source conversion unit 320 may further comprise an aberration compensator array 324 configured to compensate aberrations of each of the sub-beams. The aberrations in each sub-beam are typically present on the probe spots, 391, 392, and 393 that would be formed a sample surface. The aberration compensator array 324 may include a field curvature compensator array (not shown) with micro-lenses. The field curvature compensator and micro-lenses are configured to compensate the sub-beams for field curvature aberrations evident in the probe spots, 391, 392, and 393. The aberration compensator array 324 may include an astigmatism compensator array (not shown) with micro-stigmators. The micro-stigmators are controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 323_2, and 323_3 to bend the sub-beams 311, 312, and 313 respectively. The pre-bending micro-deflectors 323_1, 323_2, and 323_3 may bend the path of the sub-beams onto the beamlet-limit aperture array 321. The sub-beam path of the incident on beamlet-limit aperture array 321 may be orthogonal to the plane of orientation of the beamlet-limit aperture array 321. The condenser lens 310 may direct the path of the sub-beams onto the beamlet-limit aperture array 321. The condenser lens 310 may focus the three sub-beams 311, 312, and 313 to become parallel beams along primary electron-optical axis 304, so that it is perpendicularly incident onto source conversion unit 320, which may correspond to the beamlet-limit aperture array 321.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

In source the conversion unit 320, the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the sub-beam 311 path may already correspond to the electron-optical axis 304 prior to reaching micro-deflector 322_1, accordingly the sub-beam 311 path may not be deflected by micro-deflector 3221.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. The deflection angles of sub-beams 311 to 313 are adjusted by the objective lens 311 to reduce the off-axis aberrations of three probe spots 391~393. The three deflected sub-beams consequently pass through or approach the front focal point of objective lens 331.

At least some of the above-described components in FIG. 2 and FIG. 3 may individually, or in combination with each other, be referred to as a manipulator array, or manipulator, because they manipulate one or more beams, or sub-beams, of charged particles.

The above-described multi-beam inspection tool comprises a multi-beam charged particle apparatus, that may be referred to as a multi-beam charged particle optical apparatus, with a single source of charged particles. The multi-beam charged particle apparatus comprises an illumination apparatus and a projection apparatus. The illumination apparatus may generate a multi-beam of charged particles from the beam of electrons from the source. The projection apparatus projects a multi-beam of charged particles towards a sample. At least part of the surface of a sample is scanned with the multi-beam of charged particles.

A multi-beam charged particle apparatus comprises one or more electron-optical devices for manipulating the sub-beams of the multi-beam of charged particles. The applied manipulation may be, for example, a deflection of the paths of sub-beams and/or a focusing operation applied to the sub-beams.

An electron-optical device comprises an electron-optical assembly as well as the necessary supporting structures of the electron-optical assembly, such as a PCB for providing both a structural support and the electrical connections to the electron-optical assembly. The electron-optical assembly comprises the components for manipulating the one or more beams of charged particles. Each electron-optical assembly may comprise a plurality of stacked layers with each layer comprising one or more substrates. Within one or more of the layers are a plurality of components with each component arranged to manipulate a sub-beam of the multi-beam.

It is necessary for each electron-optical assembly to meet a performance specification in order for the electron-optical assembly to be suitable for use in an electron-optical device.

According to known techniques, the performance of an electron-optical assembly cannot be tested during its manufacture. The performance can only be determined when the electron-optical assembly is comprised by an electron-optical device that is installed in a multi-beam charged particle apparatus that performs, for example, SEM or lithography. This is expensive because the electron-optical device needs to be completely manufactured and installed in the charged particle apparatus together with all of the supporting devices required for it. The time-consuming process of generating a vacuum within the charged particle apparatus may also need to be performed. In addition, it may not be possible to determine the performance of the electron-optical device on its own. It may only be possible to determine the performance of the electron-optical device together with the performance of other devices in the optical path of the charged particle apparatus.

Embodiments provide a tool for testing the performance of an electron-optical assembly. Advantageously, the tool according to embodiments may allow the performance of only an electron-optical assembly to be determined without the construction of a complete electron-optical device. In addition, the performance of an electron-optical assembly may be determined at a number of stages during the manufacture of the electron-optical assembly. Any potential problems with the performance of the electron-optical assembly can therefore be determined quickly and any defective electron-optical assemblies removed from the electron-optical device production process. When testing the electron-optical assembly, the tool can illuminate the electron-optical assembly with charged particles that have a lower power than the required power of charged particles when a charged particle apparatus for SEM or lithography is used. It is therefore easier for the tool according to embodiments to be used safely than a charged particle apparatus. However, embodiments also include testing the electron-optical assembly with the same power of charged particles that the electron-optical assembly will be used with when it is installed in a charged particle apparatus. Such a test may be more accurate because any performance differences that are dependent on the power of the charged particles would be avoided.

Figure 4:
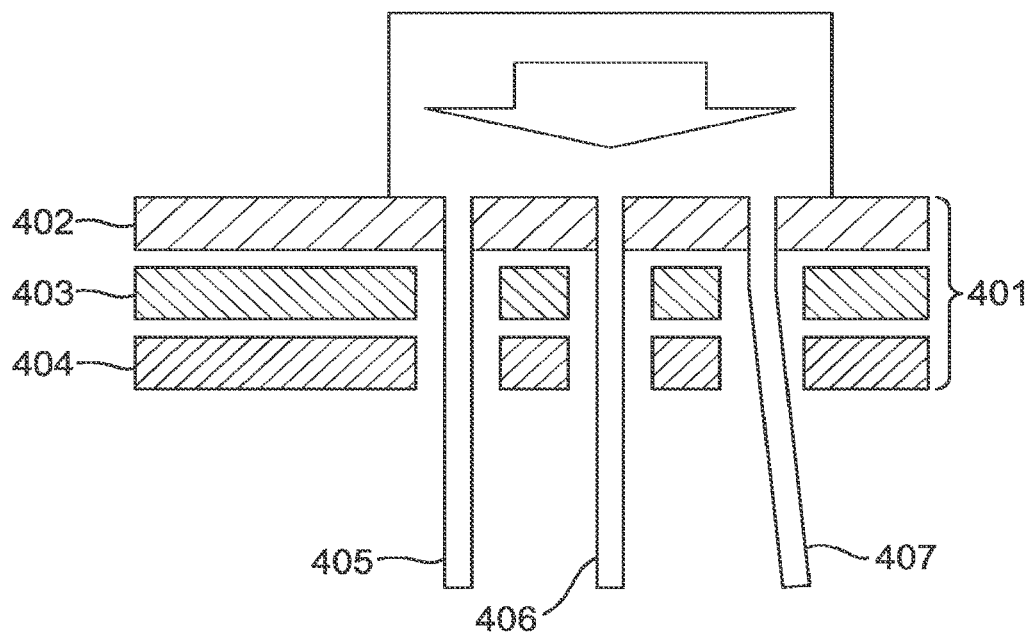
FIG. 4 shows part of an exemplary electron-optical assembly that is being tested according to some embodiments of the present disclosure.
Figure 5:
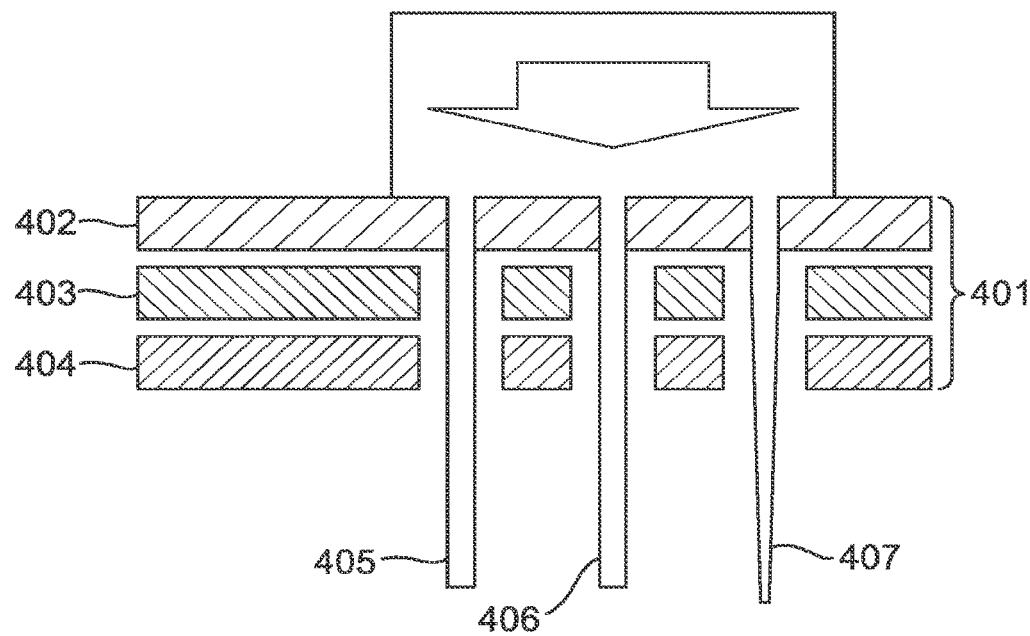
FIG. 5 shows part of an exemplary electron-optical assembly that is being tested according to some embodiments of the present disclosure.

FIG. 4 and FIG. 5 show part of an exemplary electron-optical assembly. The exemplary electron-optical assembly comprises a stack of three layers. The testing tool according to embodiments illuminates an upper surface of the electron-optical assembly with an electron beam. The upper one of the layers comprises an aperture array 402. The aperture array 402 may generate sub-beams along sub-beam paths 405, 406, 407. However, embodiments also include the sub-beams being generated by a limiting aperture up-beam of the electron-optical assembly. Embodiments also include the limiting aperture for defining the size and location of the sub-beams being located down beam of the electron-optical assembly. When the limiting aperture is down beam of the electron-optical assembly, the testing tool may still test the performance of the active elements in the electron-optical assembly.

The sub-beams pass through the aperture array 401 and on through the other layers in the stack. One of the other layers in the stack comprises a deflector array 403 that comprises a plurality of deflector elements. Each deflector element is arranged to deflect the path of a sub-beam. Another one of the layers in the stack is a lens array 404 that comprises a plurality of lens elements. Each lens element is arranged to focus a sub-beam. In some embodiments, the stack has a single layer of an array of apertures that function to manipulate an array of beam paths, for example either as an array of deflectors or an array of lensing apertures. There can be as many sets of layers in the stack as required. Each set of layers may correspond to a different array of manipulating devices or non-manipulating devices. The manipulating or non-manipulating devices within each array may all be the same type, or an array may comprise more than type of manipulating or non-manipulating device. Embodiments allow the testing of both manipulating and non-manipulating devices.

In FIG. 4, the plurality of the deflector apertures may be selectively operated. If the deflector apertures are multi-pole arrangements with multiple electrodes, the electrodes may be selectively operated in each deflector aperture. Selective operation of the deflector apertures may mean that only one deflector aperture is operated. For example, as shown representatively in FIG. 4, the paths of sub-beams 405 and 406 are not deflected by deflector elements in the deflector array. However, the path of sub-beam 407 is deflected by a deflector element in the deflector array.

In FIG. 5, the plurality of the lensing apertures in the lens array are selectively operated. Selective operation of the lensing apertures could mean that only one lensing aperture is operated. For example, as shown representatively in FIG. 5, the sub-beams 405 and 406 are not focused by lens elements in the lens array. However, sub-beam 407 is focused by a lens element in the lens array.

Figure 6:
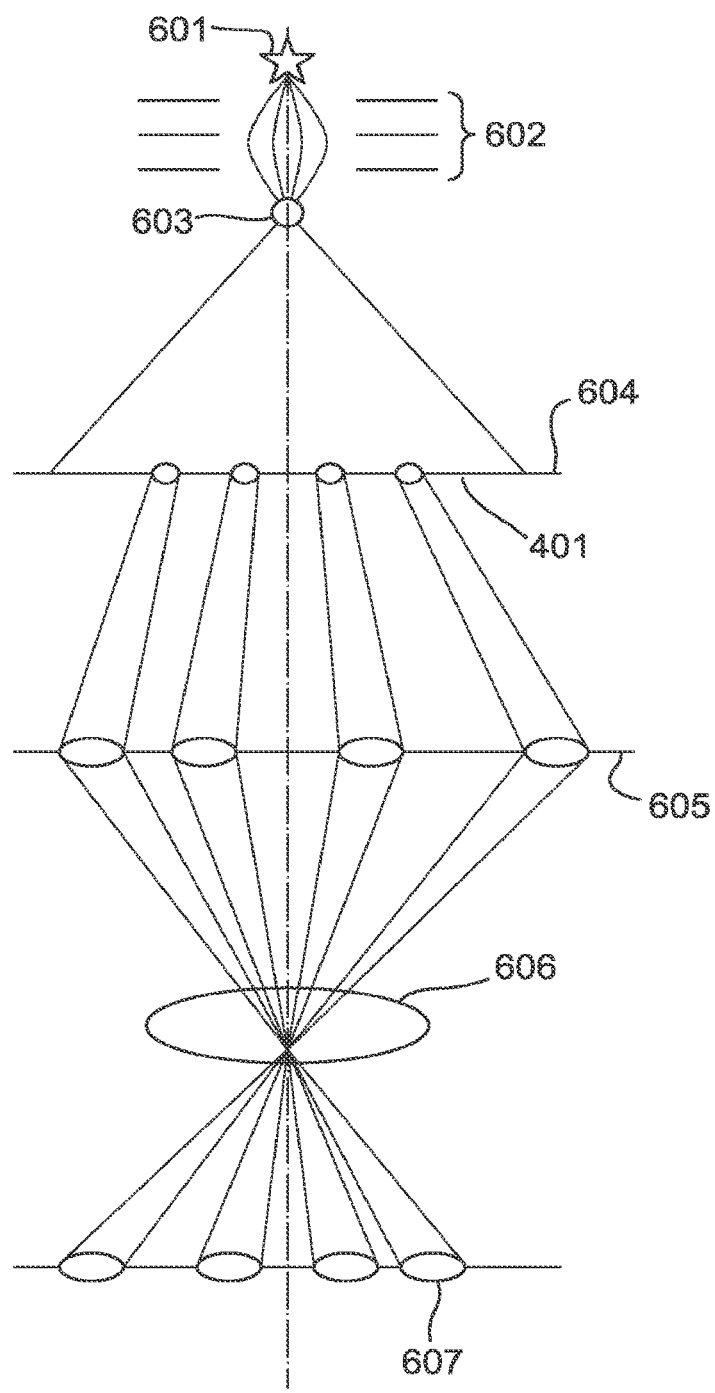
FIG. 6 shows a tool that is a system for testing the performance of a sample, such as an electron-optical assembly, according to some embodiments of the present disclosure.

FIG. 6 shows a tool that is a system for testing the performance of a sample, such as an electron-optical assembly, according to embodiments.

The tool comprises a cathode 601 that is a source of charged particles. The charged particles are manipulated by an electro-static lens 602 so as to provide virtual source 603. A sample holder 604 is arranged to hold a sample. The sample may be an electron-optical assembly 401. The tool may further comprise a scintillator 605, an optical lens 606 and a light detector 607. The light detector 607 may be a photonic sensor. The scintillator is arranged to generate, and emit from its lower surface, a light beam in dependence on each beam of charged particle that illuminates part of the upper surface of the scintillator. The scintillator may comprise yttrium aluminium garnet and/or other suitable materials for scintillation. The optical lens 606 is arranged to focus the light beams that are emitted from the scintillator 605. An upper surface of the light detector 607 is illuminated with light from the optical lens 606. The light detector 607 is arranged to generate signals corresponding to each beam of incidence of light. Together the signals comprise detection data in dependence on the received light. The detection data may comprise an image of the illuminated areas on the upper surface of the light detector 607.

When the tool is used to test an electron-optical assembly 401, the upper surface of the electron-optical assembly 401 is illuminated with a beam of charged particles. Sub-beams of charged particles are generated by the aperture array and a plurality of sub-beams of charged particles are output from the electron-optical assembly 401. The scintillator 605 is illuminated by the sub-beams and generates an optical beam for each sub-beam that it is illuminated. The light detector 607 then generates detection data in dependence on the generated optical beams.

It should be noted that apertures in the aperture array of the electron-optical assembly may have any arrangement. In FIG. 6, the pitch, i.e., spacing, between adjacent apertures is not constant. However, embodiments also include the pitch between adjacent apertures being constant. In addition, the beams may be arranged to cross each other at the center, i.e. mid-point, of the optical lens 606.

Figure 7A:
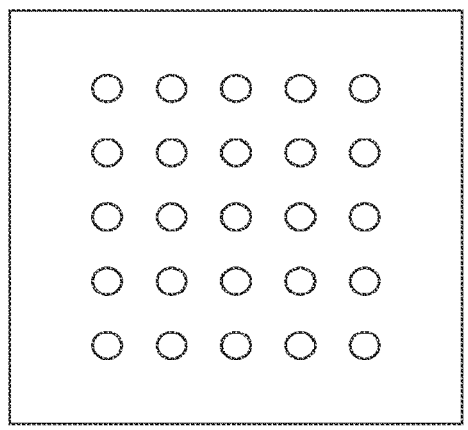
FIG. 7A, FIG. 7B and FIG. 7C are examples of images that may be comprised by, or generated in dependence on, the detection data according to some embodiments of the present disclosure.
Figure 7B:
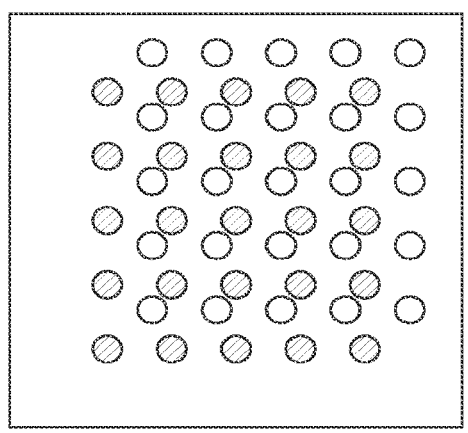
Figure 7C:
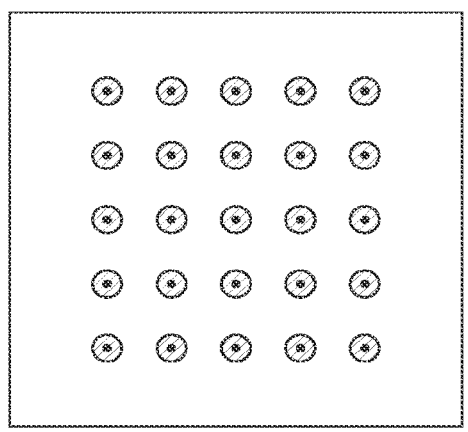

FIG. 7A, FIG. 7B and FIG. 7C are examples of images that may be comprised by, or generated in dependence on, the detection data.

FIG. 7A shows the illuminated areas on the surface of the light detector. Each circular spot in FIG. 7A corresponds to an optical beam that illuminates the surface of the light detector. The position and shape of each of the optical beams is dependent on the shape and path of a corresponding sub-beam of charged particles that is generated by, and output from, the electron-optical assembly.

FIG. 7A shows an image that has been generated by illuminating an electron-optical assembly that comprises aperture, deflector and lens elements. The elements may be the same as those described with reference to FIGS. 4 and 5. However, the number and arrangement of the elements differs because the elements are arranged in a 5 by 5 array. All of the deflector elements are in a first operation state in which a deflection is not applied to the paths of the sub-beams. All of the lens elements are in a first operation state in which a focus is not applied to the sub-beams.

FIG. 7B is an image that shows spots that have been generated by illuminating an electron-optical assembly when all of the deflector elements are in a second operation state. In the second operation state, a deflection is applied to the paths of the sub-beams. FIG. 7B also shows spots in corresponding positions to the spots in FIG. 7A in order to clearly demonstrate the differences between the first and second operation states of the deflector elements. The magnitude and direction of the deflection applied by each of the deflector elements can be determined by comparing the positions of each of the spots when the deflector elements are in the first and second operation states. In the depicted operational test, a common deflection is applied to all of the deflector elements. This may be a preferred mode of testing. However, any selection of the deflector elements may be operated for the operational test.

FIG. 7C is an image that shows spots that have been generated by illuminating an electron-optical assembly when all of the lens elements are in a second operation state. In the second operation state, a focus is applied to the sub-beams. FIG. 7C also shows spots in corresponding positions to the spots in FIG. 7A in order to clearly demonstrate the differences between the first and second operation states of the lens elements. The focus applied by each of the lens elements can be determined by comparing the size and position of each of the spots when the lens elements are in the first and second operation states. In the depicted operational test, a common focus is applied by all of the lens elements in the electron-optical assembly. This may be a preferred mode of testing. However, any selection of the lens elements may be operated for the operational test.

Accordingly, embodiments provide a tool for generating determination data that can be used to determine the performance of an electron-optical assembly. Comparisons can be made between the measured and expected performances of the manipulation characteristics of components of the electron-optical assembly. A determination can be made as to whether or not the electron-optical assembly meets all its performance specifications.

Embodiments also include a number of modifications and variations to the techniques as described above.

In particular, the tool according to embodiments may generate the detection data in dependence on other techniques than scintillation. The tool according to embodiments may therefore not comprise the above-described scintillator 605, an optical lens 606 and a light detector 607. The tool according to embodiments may alternatively comprise a charged particle detector. The charged particle detector may be illuminated by sub-beams of charged particles that have passed through the electron-optical assembly. The detection data may be generated in dependence on the received sub-beams by the charged particle detector. The charged particle detector may, for example, be a charge-coupled device, CCD, p/n detector, or CMOS sensor.

As described above, an electron-optical assembly may comprise a stack of a plurality of layers with each layer comprising one or more substrates. One or more of the layers may comprise an array of components for manipulating sub-beams. The manufacturing process of the electron-optical assembly may therefore comprise a first set of processes for manufacturing each of the layers to be included in the stack and a second set of processes for building a stack of layers.

The manufacturing process of an electron-optical device comprising the electron-optical assembly comprises a further set of processes for attaching and electrically connecting the stack of substrates to a PCB.

An advantage of the tool according to embodiments is that it may be used to test the components of the electron-optical assembly during the different stages of construction of the electron-optical assembly in addition to an electron-optical device.

In particular, electrical connectors may be temporarily applied to any one of the layers that comprises an array of components so that the operation state of the components may be controlled. The tool according to embodiments may therefore be used to determine if the performance of an individual layer is within its performance specifications before separate layers are built together into a stack. The term electron-optical assembly, as used herein, may therefore refer to a single layer or a stack comprising a plurality of layers.

The tool according to embodiments may also be used to determine if the performance of the final stack of substrates is within its performance specification before the stack is attached to its supporting structure, such as a PCB. Advantageously, the tool allows any defective layers and/or stacks to be quickly determined and manufacturing costs to thereby be reduced. A stack of substrates does not meet its performance specifications may be removed from the electron-optical device production process.

Another advantage of the tool according to embodiments is that the performance of an electron-optical assembly can be determined using a charged particle source that is operated at a lower power than the charged particle source in a charged particle apparatus for SEM or lithography. The charged particle source in the tool according to embodiments needs to only be powerful enough for the sub-beams that have passed through the electron-optical assembly to be detected. Sources with substantially higher power, for example amongst other specific characteristic requirements, are required in charged particle apparatuses for applications such as SEM and lithography. However, embodiments also include testing the electron-optical assembly with the same power of charged particles that the electron-optical assembly will be used with when it is installed in a charged particle apparatus. Such a test may be more accurate because any performance differences that are dependent on the power of the charged particles would be avoided.

The tool according to embodiments may typically be operated with electron beam that has the properties: 5 keV, 125 μA beam, spread over a beam with diameter of about 1 cm. However, the operational range of the tool may be over a wide range. For example, the electron beam properties may be: 1 keV-30 keV, 1 μA-1 mA beam, spread over a beam with diameter of about of 0.1 mm to 20-30 cm.

In a charged particle apparatus for SEM or lithography, the properties of the electron beam may be: 30 keV, 5 nA or larger. The spot size of each beam may vary from 0.1 nm to 100 nm.

Operating with low power charged particle sources may be safer, easier and cheaper. For example, it may reduce the amount x-rays that are generated and the measures necessary to protect operators from x-rays. In addition, a source with lower power requirements than those required for SEM or lithographic applications is more commercially available.

The tool according to embodiments has been described with reference to an electron-optical assembly for manipulating a multi-beam of charged particles. Embodiments also include the tool being used to determine the performance of an electron-optical assembly for manipulating a single beam of charged particles. Embodiments also include the tool being used to determine the performance of other types of sample than an electron-optical assembly.

The tool according to the disclosed embodiments may comprise one or more computing devices for determining the performance of the electron-optical assembly, or other sample, that is tested by the tool in dependence on the detection data generated by the tool.

The tool according to the disclosed embodiments may comprise one or more computing devices for controlling the operation of the tool and/or electron-optical assembly, or other sample, that is tested by the tool.

Embodiments also include techniques for determining and analyzing the properties of features in images. The techniques according to embodiments may improve the accuracy with which the contour, i.e., edge points, of each feature can be determined. The techniques according to embodiments may also provide efficient techniques for analyzing features. The techniques according to embodiments are particularly appropriate for analyzing images such as those shown in FIGS. 7A to 7C.

FIGS. 7A to 7C show a plurality of substantially circular features, with each feature corresponding to the aperture through a component of a MEMS array. The performance of the components in the MEMS array can be determined in dependence on an analysis of the substantially circular features with the MEMS array in any operating state. For example, the circular properties of each of the features and/or relative positions of each of the features may be determined. As described earlier, the performance of the components in the MEMS array may also be determined in dependence on a comparison of the features in images generated with the components of the MEMS array in different operating states.

Figure 8:
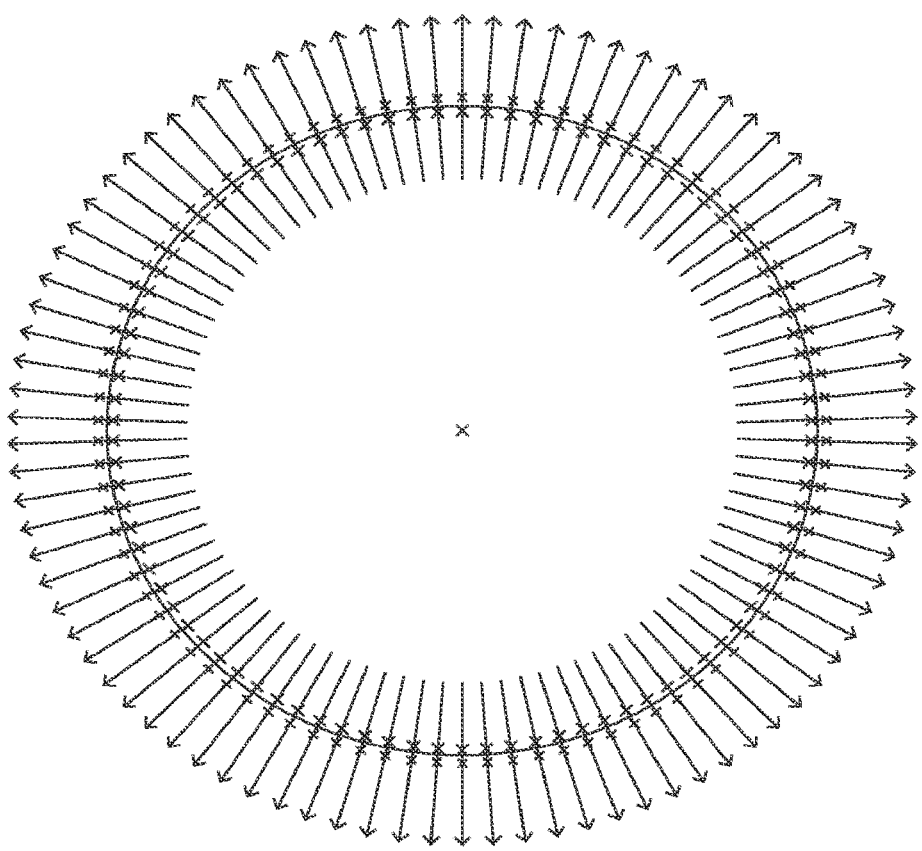
FIG. 8 shows a step in a technique for determining the position of each of a plurality of points on the edge of an imaged substantially circular feature according to some embodiments of the present disclosure.
Figure 9A:
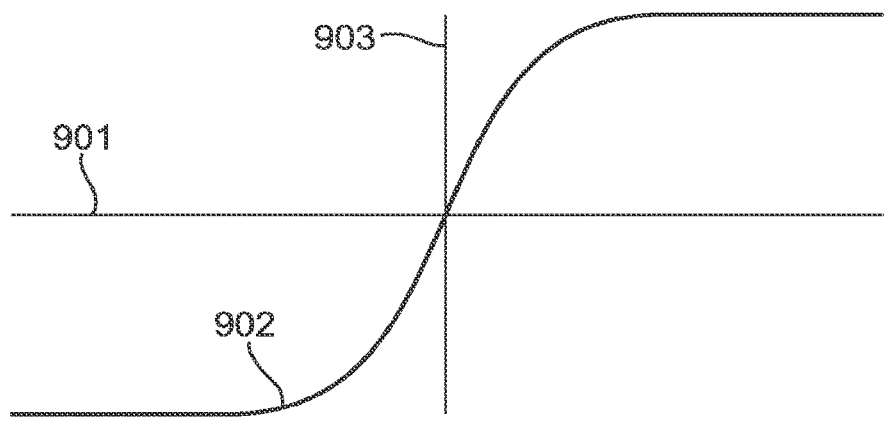
FIG. 9A shows an intensity profile variation across an edge of a feature.
Figure 9B:
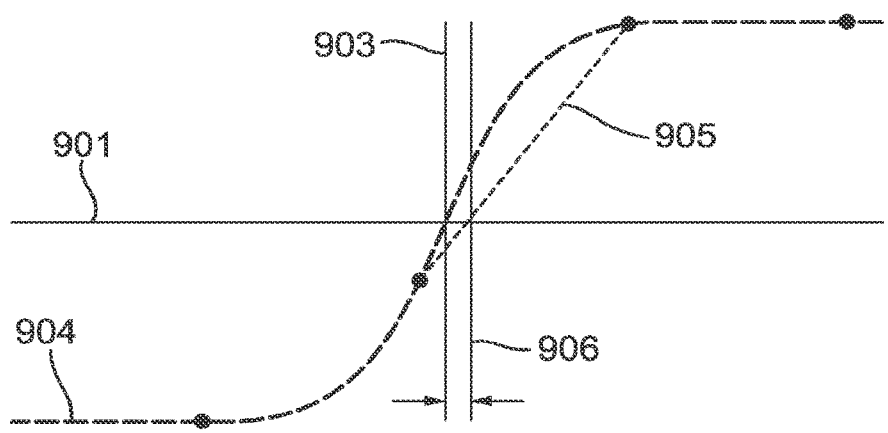
FIG. 9B shows a technique for determining the location of an edge of a feature according to some embodiments of the present disclosure.

FIGS. 8, 9A and 9B show a technique for determining the position of each of a plurality of points on the edge of an imaged substantially circular feature according to embodiments. As shown in FIG. 8, embodiments include determining an approximate location of the center point of the feature. Intensity measurements are then obtained at a plurality of locations on each of a plurality of straight lines that each extend from the determined center point of the feature to a point outside of the feature. On each straight line, intensity measurements are therefore obtained on either side of the edge of the feature. The angular spacing between adjacent ones of the plurality of straight lines may be equal.

FIG. 9A shows how the actual intensity profile may vary along one of the straight lines that extends from the determined center point of the feature. In FIG. 9A, the x-axis 901 corresponds to a distance, on the straight line, from the determined center point of the image. The y-axis corresponds to an intensity value, such as a grey value, at each position on the axis. The continuous intensity profile 902 varies along the x-axis 901. At the center point of the feature, the intensity profile may be at a local minimum value, indicated by the intensity values at the leftmost part of FIG. 9A. On the other side of the edge of the feature, i.e., at positions outside of the feature, the intensity profile may be at a local maximum value, indicated by the intensity values at the rightmost part of FIG. 9A. A point on the edge of the feature may be determined as the point on the x-axis 901 at which the intensity is the mid-intensity between the local maximum and local minimum intensities. This approach determines the edge position to be at the x-axis location 903. However, the intensity measurements along the line are measurements at discrete points along the line and not the continuous measurement shown in FIG. 9A. FIG. 9B shows the location of discrete regularly spaced intensity measurement pixels on the same straight line as that shown in FIG. 9A. For each pixel, the intensity value of the pixel may be determined in dependence on a bilinear interpolation of the intensity values of the four nearest pixels to said pixel. The intensity values may be grey values.

According to known techniques for determining the location of the edge of the feature, the location on the x-axis 901 that corresponds to the mid-intensity between the local maximum and local minimum intensities is determined by linear interpolation between the locations of the discrete intensity measurement points on either side of the mid-intensity value. As shown in FIG. 9B, the linearly interpolated line 905 determines the x-axis 901 position of the edge to be at 906 instead of 903. The difference along the x-axis 901 between 906 and 903 is therefore an error in the determination of the location of a point in the edge of the feature.

Embodiments provide an alternative technique for determining the x-axis 901 position that corresponds to the mid-intensity between the local maximum and local minimum intensities. The theoretically ideal intensity profile shown in FIG. 9A mathematically corresponds to the convolution of an Airy disc with a step function. Embodiments include approximating the Airy disc with a Gaussian function. The convolution of the Gaussian function with a step function gives an Error function. Embodiments include fitting the Error function to the discrete intensity measurements to thereby generate an estimated intensity profile 904 as shown in FIG. 9B. The x-axis position corresponding to the mid-intensity between the local maximum and local minimum intensities is then determined in dependence on the estimated intensity profile 904.

Embodiments may therefore provide a substantially more accurate technique for determining the location of a point on the edge of the feature than known techniques. Embodiments include determining the location of each of a plurality of points on the edge of the feature in dependence on a respective plurality of straight lines, as shown in FIG. 8, and an estimated intensity profile 904, as described with reference to FIG. 9B. The plurality of points on the edge of the feature may be used to determine a contour of the feature.

Embodiments also include techniques for analyzing the contour angular errors, i.e., circular properties, of each feature in an image.

Figure 10A:
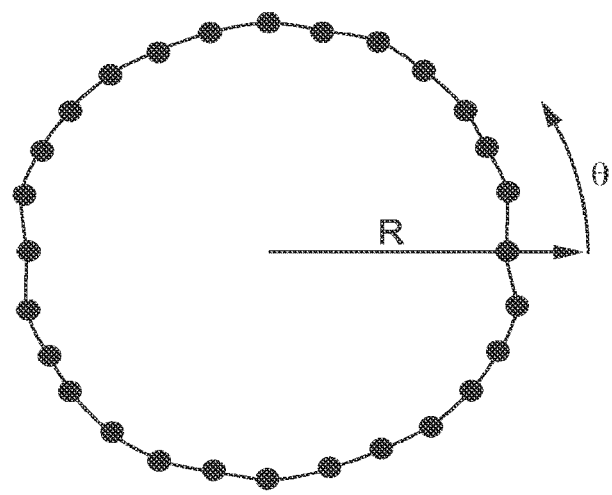
FIG. 10A shows points on the contour of an imaged feature.
Figure 10B:
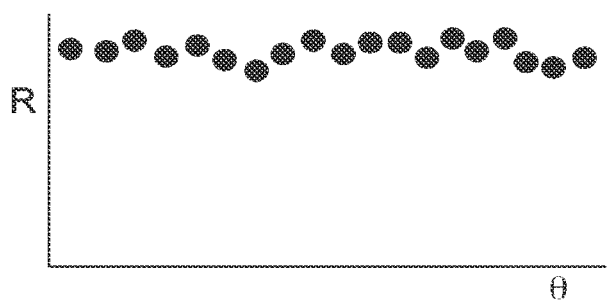
FIG. 10B shows a polar coordinate representation of points on the contour of an imaged feature.

For each feature in an image, a plurality of points on the edge of the feature may be determined according to the techniques of the above-described embodiments, or other image analysis techniques. FIG. 10A shows such points on the edge of a feature. Each of the points on the edge of the feature is converted to a polar coordinate representation so that it is represented by $\{R, \theta\}$ values, as shown in FIG. 10B. The $\{R, \theta\}$ values are a polar coordinate dataset for the points on the edge of the feature. A transform operation is then applied to the polar coordinate dataset. The transform operation may be a Fourier Transform, such as the Fast Fourier Transform (FFT) or Discrete Fast Fourier Transform (DFFT).

Figure 10C:
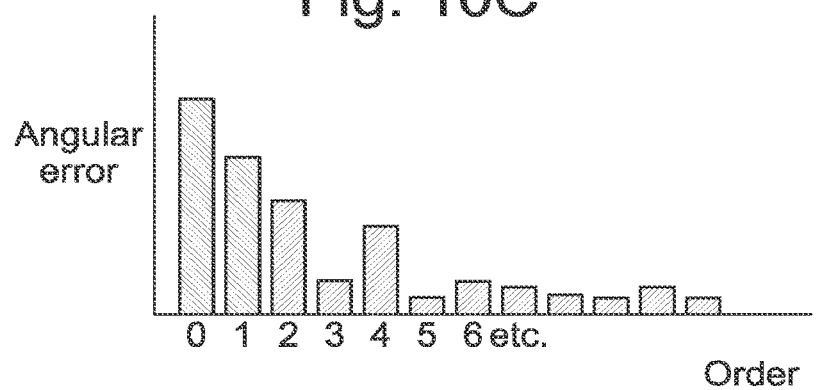
FIG. 10C shows an analysis technique of a contour of an imaged feature according to some embodiments of the present disclosure.

FIG. 10C shows image analysis results that may be generated by applying an FFT to the polar coordinate dataset in FIG. 10B. In FIG. 10C, the x-axis provides orders of wave numbers, and the y-axis provides angular error values. The $0^{th}$ order wave number indicates the radius of the feature. The $1^{st}$ order wave number indicates the difference between the determined center point of the feature for generating the polar coordinates and an actual center of the feature. The $2^{nd}$ order wave number is a measure of the elliptical properties of the feature. The $3^{rd}$ and higher order wave numbers are indicative of higher order aberrations in the contour of the feature.

By using the above-described techniques, embodiments allow the contour angular errors, i.e., circular properties, of a feature to be easily and efficiently determined.

The above-described techniques according to embodiments are not restricted to use with circular features. Embodiments include the techniques being used to determine the location of points on the edge of a feature with any shape and/or the analysis of features with substantially non-circular contours. When the techniques are used in the analysis of features with substantially non-circular contours, the $2^{nd}$ order wave number, and higher wave numbers, may comprise a component that is related to the shape of the contour and not just aberrations.

In addition, the above-described techniques according to embodiments are not restricted to the specific application of an analyzing an image obtained in the testing of an electron-optical assembly. The techniques may be used more generally in the analysis of images obtained in any application, such as a metrology or inspection application.

The tool according to embodiments allows the testing of the performance of an electron-optical assembly. The performance may be determined in a number of different ways. For example, the tool may simply indicate either that the electron-optical assembly passes a test or that it fails a test. For example, the electron-optical assembly may be controlled so that correct operation will deflect all of the beams being tested to the right. If the beams being tested are all deflected to the right by more than a minimum amount, then the result of the test is a pass regardless of the actual magnitude and specific direction of the deflection amount. The tool may separately provide the circular properties of each beam using the above-described techniques.

The tool may additionally, or alternatively, provide a qualitative measurement of a performance aspect. For example, in addition to providing the circular properties of each beam, it may determine and output the specific magnitude and direction of the deflection of each beam. These properties could be provided alongside data on the applied deflection voltages, e-beam energies and other operating conditions.

The tool may additionally, or alternatively, test the electrical connections to each element in the electron-optical assembly. The numerous electrical connection paths that connect a controller to each of the electrodes of the elements may require some long and difficult routing and linking. The test output may therefore be a determination of whether or not the electrical connection paths for the electron-optical assembly are all correct.

The tool may additionally, or alternatively, determine that the elements in the electron-optical assembly are appropriately located for alignment with the sub-beams of a multi-beam. However, the deflection, or focus, performance of the elements may not be tested.

Embodiments include a number of modifications and variations to the techniques described above.

An electron-optical device that is tested and made according to embodiments may be used in a multi-beam charged particle apparatus. The multi-beam charged particle apparatus may be a component of an inspection (or metro-inspection) tool or part of an e-beam lithography tool. The multi-beam charged particle apparatus may be used in a number of different applications that include electron microscopy in general, not just SEM, and lithography. The multi-beam charged particle apparatus may comprise more than one source of charged particles.

In the examples described with reference to FIGS. 9A and 9B, at the center point of the feature the intensity profile is at a local minimum value and on the other side of the edge of the feature the intensity profile is at a local maximum value. Embodiments also include alternative applications, and ways of generating images, in which at the center point of the feature the intensity profile is at a local maximum value and on the other side of the edge of the feature the intensity profile is at a local minimum value.

Embodiments include the following statements.

According some embodiments, there is provided an electron-optical assembly testing system for testing an electron-optical assembly, the system comprising: a source of charged particles configured to emit a beam of charged particles; an electron-optical assembly holder configured to hold an electron-optical assembly to be tested such that, when the system is in use with an electron-optical assembly held by the electron-optical assembly holder, the electron-optical assembly is illuminated by the beam; and a sub-beam detector for detecting sub-beams of charged particles that have been transmitted through the electron-optical assembly.

Preferably, the sub-beam detector comprises a scintillator configured to emit a plurality of sub-beams of light in dependence on respective plurality of sub-beams of charged particles incident on the scintillator.

Preferably, the sub-beam detector comprises a photonic sensor configured to detect each sub-beam of light corresponding to each incidental sub-beam of charged particles.

Preferably, the sub-beam detector comprises a detection data generator configured to generate detection data in dependence on sub-beams of light incident on the photonic sensor.

Preferably, the scintillator comprises yttrium aluminium garnet.

Preferably, the sub-beam detector is configured to: sense the sub-beams of charged particles incident on the sub-beam detector; and generate detection data in dependence on the incident sub-beams of charged particles.

Preferably, the sub-beam detector is a charge-coupled device, CCD, p/n detector and/or CMOS sensor.

Preferably, the detection data is suitable for generating one or more images that are indicative of the focus and or deflection states of the sub-beams of charged particles.

Preferably, the system further comprises one or more computing devices, wherein each computing device is configured to: determine the performance of an electron-optical assembly; and/or control the test of an electron-optical assembly by the electron-optical assembly testing system.

Preferably, the electron-optical assembly is configured to simultaneously manipulate each of a plurality of beams of charged particles.

Preferably, a computing device is configured to control the test of the deflection and/or focus of an electron-optical assembly.

Preferably, the electron-optical assembly comprises a stack of layers; each layer in the stack comprises one or more substrates; and one or more layers in the stack comprises a plurality of MEMS components.

Preferably, the electron-optical assembly is comprised by an electron-optical device for use in a charged particle apparatus for SEM or lithography.

According to some embodiments, there is provided a method of testing an electron-optical assembly, the method comprising: illuminating the electron-optical assembly with at least one beam of charged particles such that charged particles in the at least one beam are transmitted through the electron-optical assembly in a plurality of sub-beams; detecting sub-beams of charged particles that have been transmitted through the electron-optical assembly; and determining the performance of the electron-optical assembly in dependence on the detected sub-beams; wherein the test of the determination of the performance of the electron-optical assembly is made prior to use of an electron-optical device, that comprises the electron-optical assembly, in a charged particle apparatus for SEM or lithography.

Preferably, said step of detecting sub-beams of charged particles that have been transmitted through the electron-optical assembly comprises: generating, by scintillation, a plurality of sub-beams of light that respectively correspond to the sub-beams of charged particles; detecting each of the plurality of sub-beams of light; and generating a detection data signal in dependence on the sub-beams of light.

Preferably, said step of detecting sub-beams of charged particles that have been transmitted through the electron-optical assembly comprises: detecting the sub-beams of charged particles transmitted from the electron-optical assembly; and generating a detection data signal in dependence on the detected sub-beams of charged particles.

Preferably, the sub-beams are detected by a charge-coupled device, CCD, p/n detector and/or CMOS sensor.

Preferably, said step of determining the performance of the electron-optical assembly in dependence on the detected sub-beams comprises determining the performance of the electron-optical assembly in dependence on the detection data signal.

Preferably, the method further comprises using detection data in the detection data signal to generate one or more images.

Preferably, the electron-optical assembly is configured to deflect the paths of the sub-beams and/or focus the sub-beams so that the detection data corresponds to the sub-beam deflection and/or performance of the electron-optical assembly.

Preferably, determining the performance of the electron-optical assembly comprises comparing a determined deflection and/or focus against an expected deflection and/or focus.

Preferably, the power of the at least one beam of charged particles that the electron-optical assembly is illuminated with is less that the power that the electron-optical device is illuminated with when it is used in the charged particle apparatus for SEM or lithography.

Preferably, the method further comprises determining to comprise the electron-optical assembly in an electron-optical device in dependence on the determined performance of the electron-optical assembly.

Preferably, the method further comprises determining to use the electron-optical device a charged particle apparatus for SEM or lithography.

Preferably, the method further comprises: generating a first image when the electron-optical assembly is in a first sub-beam deflection state; generating a second image when the electron-optical assembly is in a second sub-beam deflection state that is different from the first sub-beam deflection state; determining the deflection performance of the electron-optical assembly in dependence on a comparison of the first image and the second image.

Preferably, the method further comprises: generating a first image when the electron-optical assembly is in a first sub-beam focus state; generating a second image when the electron-optical assembly is in a second sub-beam focus state that is different from the first sub-beam focus state; and determining the focus performance of the electron-optical assembly in dependence on a comparison of the first image and the second image.

Preferably, the electron-optical assembly comprises a stack of layers; each layer in the stack comprises one or more substrates; and one or more layers in the stack comprises a plurality of MEMS components arranged in an array.

Preferably, the electron-optical assembly is comprised by an electron-optical device for use in a charged particle apparatus for SEM or lithography.

Preferably, the method of testing an electron-optical assembly is performed during the manufacture of an electron-optical device for use in a charged particle apparatus for SEM or lithography.

Preferably, the method further comprises: generating an image comprising a plurality of features in dependence on the detection data signal; and estimating, for each feature, the positions of a plurality of points on the edge of the feature; wherein estimating the position of each point on the edge of each feature comprises: obtaining a plurality of discrete intensity measurements at positions on a straight line that crosses the edge of the feature; fitting an Error function to the plurality of intensity measurements; using the Error function to determine a mid-point between local maximum and minimum values of the intensity measurements; and estimating the position of the point on the edge of the feature in dependence on the determined mid-point.

Preferably, estimating the position of each point on the edge of the feature further comprises: estimating the position of the center of the feature; and determining, for each of the plurality of points on the edge of the feature, a plurality of discrete intensity measurements at positions that lie on a straight line that intersects the estimated position of the center of the feature and the edge of the feature.

Preferably, the method further comprises determining a contour of each feature in dependence on the determined positions of the points on the edge of each feature.

Preferably, the method further comprises analyzing the properties of the contour of each feature; wherein analyzing the properties of the contour of each feature comprises: obtaining, for each feature, estimated positions of a plurality of points on the edge of the feature; converting the obtained plurality of discrete points into a dataset of polar coordinates; generating a plurality of values of wave numbers by performing a transform on the dataset of polar coordinates; and using one or more values of the wave numbers to analyze the properties of the imaged contour of the feature.

Preferably, the circular properties of the imaged contour of the feature are determined.

Preferably, the transform is a Fourier Transform.

Preferably, each feature in the image corresponds to an opening in a component for manipulating one or more electron beams.

According to some embodiments, there is provided a method of manufacturing an electron-optical device that comprises an electron-optical assembly, the method comprising: testing an electron-optical assembly according to the method of the second aspect; and determining to construct an electron-optical device that comprises the electron-optical assembly in dependence on the test.

According to some embodiments, there is provided an electron-optical assembly testing system for testing an electron-optical assembly, the system comprising: a source of charged particles configured to emit a beam of charged particles; an electron-optical assembly holder configured to hold an electron-optical assembly for testing the electron-optical assembly by transmission of charged particle beams from the source through the electron-optical assembly; and a sub-beam detector configured to detect sub-beams of charged particles transmitted from the source through the electron-optical assembly held by the holder.

Preferably, the electron-optical assembly testing system is configured to perform the method according to the second aspect.

While various embodiments have been described, other embodiments will be apparent to those skilled in the art from consideration of the specification and practice of the technology disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims and clauses as set out below.

There is provided the following clauses:

Clause 1: An electron-optical assembly testing system for testing an electron-optical assembly, the system comprising: a source of charged particles configured to emit a beam of charged particles; an electron-optical assembly holder configured to hold an electron-optical assembly to be tested such that, when the system is in use with an electron-optical assembly held by the electron-optical assembly holder, the electron-optical assembly is illuminated by the beam; and a sub-beam detector for detecting sub-beams of charged particles that have been transmitted through the electron-optical assembly.

Clause 2: The system according to clause 1, wherein the sub-beam detector comprises: a scintillator configured to emit a plurality of sub-beams of light in dependence on respective plurality of sub-beams of charged particles incident on the scintillator; and a photonic sensor configured to detect each sub-beam of light corresponding to each incidental sub-beam of charged particles; wherein the system, further comprises a detection data generator configured to generate detection data in dependence on sub-beams of light incident on the photonic sensor.

Clause 3: The system according to clause 2, wherein the scintillator comprises yttrium aluminium garnet.

Clause 4: The system according to clause 1, wherein the sub-beam detector is configured to: sense the sub-beams of charged particles incident on the sub-beam detector; and generate detection data in dependence on the incident sub-beams of charged particles.

Clause 5: The system according to clause 4, wherein the sub-beam detector is a charge-coupled device, CCD, p/n detector and/or CMOS sensor.

Clause 6: The system according to any of clauses 2 to 5, wherein the detection data is suitable for generating one or more images that are indicative of the focus and or deflection states of the sub-beams of charged particles.

Clause 7: The system according to any preceding clause, further comprising one or more computing devices, wherein each computing device is configured to: determine the performance of an electron-optical assembly; and/or control the test of an electron-optical assembly by the electron-optical assembly testing system.

Clause 8: The system according to any preceding clause, wherein the electron-optical assembly is configured to simultaneously, or individually, manipulate each of a plurality of beams of charged particles.

Clause 9: The system according to clause 8, wherein a computing device is configured to control the test of the deflection and/or focus of an electron-optical assembly.

Clause 10: The system according to any preceding clause, wherein the electron-optical assembly comprises a stack of layers; each layer in the stack comprises one or more substrates; and one or more layers in the stack comprises a plurality of MEMS components.

Clause 11: The system according to any preceding clause, wherein the electron-optical assembly is comprised by an electron-optical device for use in a charged particle apparatus for SEM or lithography.

Clause 12: A method of testing an electron-optical assembly, the method comprising: illuminating the electron-optical assembly with at least one beam of charged particles such that charged particles in the at least one beam are transmitted through the electron-optical assembly in a plurality of sub-beams; detecting sub-beams of charged particles that have been transmitted through the electron-optical assembly; and determining the performance of the electron-optical assembly in dependence on the detected sub-beams; wherein the test of the determination of the performance of the electron-optical assembly is made prior to use of an electron-optical device, that comprises the electron-optical assembly, in a charged particle apparatus for SEM or lithography.

Clause 13: The method according to clause 12, wherein said step of detecting sub-beams of charged particles that have been transmitted through the electron-optical assembly comprises: generating, by scintillation, a plurality of sub-beams of light that respectively correspond to the sub-beams of charged particles; detecting each of the plurality of sub-beams of light; and generating a detection data signal in dependence on the sub-beams of light.

Clause 14: The method according to clause 12, wherein said step of detecting sub-beams of charged particles that have been transmitted through the electron-optical assembly comprises: detecting the sub-beams of charged particles transmitted from the electron-optical assembly; and generating a detection data signal in dependence on the detected sub-beams of charged particles.

Clause 15: The method according to clause 14, wherein the sub-beams are detected by a charge-coupled device, CCD, p/n detector and/or CMOS sensor.

Clause 16: The method according to any of clauses 13 to 15, wherein said step of determining the performance of the electron-optical assembly in dependence on the detected sub-beams comprises determining the performance of the electron-optical assembly in dependence on the detection data signal.

Clause 17: The method according to any of clauses 13 to 16, further comprising using detection data in the detection data signal to generate one or more images.

Clause 18: The method according to any of clauses 12 to 17, wherein the electron-optical assembly is configured to deflect the paths of the sub-beams and/or focus the sub-beams.

Clause 19: The method according to clause 18, wherein determining the performance of the electron-optical assembly comprises comparing a determined deflection and/or focus against an expected deflection and/or focus.

Clause 20: The method according to any of clauses 12 to 19, wherein the power of the at least one beam of charged particles that the electron-optical assembly is illuminated with is less that the power that the electron-optical device is illuminated with when it is used in the charged particle apparatus for SEM or lithography.

Clause 21: The method according to any of clauses 12 to 20, the method further comprising determining to comprise the electron-optical assembly in an electron-optical device in dependence on the determined performance of the electron-optical assembly.

Clause 22: The method according to clause 21, the method further comprising determining to use the electron-optical device a charged particle apparatus for SEM or lithography.

Clause 23: The method according to any of clauses 12 to 22, the method further comprising: generating a first image when the electron-optical assembly is in a first sub-beam deflection state; generating a second image when the electron-optical assembly is in a second sub-beam deflection state that is different from the first sub-beam deflection state; and determining the deflection performance of the electron-optical assembly in dependence on a comparison of the first image and the second image.

Clause 24: The method according to any of clauses 12 to 23, the method further comprising: generating a first image when the electron-optical assembly is in a first sub-beam focus state; generating a second image when the electron-optical assembly is in a second sub-beam focus state that is different from the first sub-beam focus state; and determining the focus performance of the electron-optical assembly in dependence on a comparison of the first image and the second image.

Clause 25: The method according to any of clauses 12 to 24, wherein the electron-optical assembly comprises a stack of layers; each layer in the stack comprises one or more substrates; and one or more layers in the stack comprises a plurality of MEMS components arranged in an array.

Clause 26: The method according to clause 25, wherein the electron-optical assembly is comprised by an electron-optical device for use in a charged particle apparatus for SEM or lithography.

Clause 27: The method according to any of clauses 12 to 26, wherein the method of testing an electron-optical assembly is performed during the manufacture of an electron-optical device for use in a charged particle apparatus for SEM or lithography.

Clause 28: The method according to any of clauses 12 to 27, the method further comprising: generating an image comprising a plurality of features in dependence on the detection data signal; and estimating, for each feature, the positions of a plurality of points on the edge of the feature; wherein estimating the position of each point on the edge of each feature comprises: obtaining a plurality of discrete intensity measurements at positions on a straight line that crosses the edge of the feature; fitting an Error function to the plurality of intensity measurements; using the fitted Error function to determine a mid-point between local maximum and minimum values of the intensity measurements; and estimating the position of the point on the edge of the feature in dependence on the determined mid-point.

Clause 29: The method according to clause 28, wherein estimating the position of each point on the edge of the feature further comprises: estimating the position of the center of the feature; and determining, for each of the plurality of points on the edge of the feature, a plurality of discrete intensity measurements at positions that lie on a straight line that intersects the estimated position of the center of the feature and the edge of the feature.

Clause 30: The method according to clause 28 or 29, further comprising determining a contour of each feature in dependence on the determined positions of the points on the edge of each feature.

Clause 31: The method according to any of clauses 28 to 30, further comprising analyzing the properties of the contour of each feature; wherein analyzing the properties of the contour of each feature comprises: obtaining, for each feature, estimated positions of a plurality of points on the edge of the feature; converting the obtained plurality of discrete points into a dataset of polar coordinates; generating a plurality of values of wave numbers by performing a transform on the dataset of polar coordinates; and using one or more values of the wave numbers to analyze the properties of the imaged contour of the feature.

Clause 32: The method according to clause 31, wherein the circular properties of the imaged contour of the feature are determined.

Clause 33: The method according to clause 31 or 32, wherein the transform is a Fourier Transform.

Clause 34: The method according to any of clauses 28 to 33, wherein each feature in the image corresponds to an opening in a component for manipulating one or more electron beams.

Clause 35: A method of manufacturing an electron-optical device that comprises an electron-optical assembly, the method comprising: testing an electron-optical assembly according to the method of any of clauses 12 to 34; and determining to construct an electron-optical device that comprises the electron-optical assembly in dependence on the test.

Clause 36: An electron-optical assembly testing system for testing an electron-optical assembly, the system comprising: a source of charged particles configured to emit a beam of charged particles; an electron-optical assembly holder configured to hold an electron-optical assembly for testing the electron-optical assembly by transmission of charged particle beams from the source through the electron-optical assembly; and a sub-beam detector configured to detect sub-beams of charged particles transmitted from the source through the electron-optical assembly held by the holder.

Clause 37: The electron-optical assembly testing system according to clause 36, wherein the electron-optical assembly testing system is configured to perform the method according to any of clauses 12 to 34.

Clause 38: An electron-optical assembly testing system for testing an electron-optical assembly, the system comprising: a source of charged particles configured to emit a beam of charged particles; an electron-optical assembly holder configured to hold an electron-optical assembly for testing the electron optical assembly by transmission of charged particle beams from the source through the electron optical assembly; and a sub-beam detector configured to detect sub-beams of charged particles transmitted from the source through the electron-optical assembly held by the holder.

Clause 39: The system according to clause 38, wherein the sub-beam detector is a scintillator configured emit a plurality of sub-beams of light in dependence on respective plurality of sub-beams of charged particles incident on the scintillator; and the system further comprises a detection data generator configured to generate detection data in dependence on sub-beams of light incident on the detection data generator.

The invention claimed is:

1. An electron-optical assembly testing system for testing an electron-optical assembly prior to use of an electron-optical device comprising the electron-optical assembly, in a charged particle apparatus for SEM or lithography, the electron-optical assembly testing system comprising:
   a source of charged particles configured to emit a beam of charged particles;
   an electron-optical assembly holder configured to hold an electron-optical assembly to be tested prior to use of the electron-optical device comprising the electron-optical assembly, in a charged particle apparatus for SEM or lithography, such that, when the electron-optical assembly testing system is in use with an electron-optical assembly held by the electron-optical assembly holder, the electron-optical assembly is configured to be illuminated by the beam while the electron-optical device comprising the electron-optical assembly is not installed in the charged particle apparatus for SEM or lithography; and
   a sub-beam detector configured to detect sub-beams of charged particles that have been transmitted through the electron-optical assembly while the electron-optical device comprising the electron-optical assembly is not installed in the charged particle apparatus for SEM or lithography.

2. The electron-optical assembly testing system according to claim 1, wherein the source is configured to be operated at a lower power than the charged particle source in the charged particle apparatus for SEM or lithography.

3. The electron-optical assembly testing system according to claim 1, the electron-optical assembly to be tested is at a number of different stages during the manufacture of the electron-optical assembly and/or after the complete manufacture of the electron-optical assembly.

4. The electron-optical assembly testing system according to claim 1, wherein the sub-beam detector comprises:
   a scintillator configured to emit a plurality of sub-beams of light in dependence on respective plurality of sub-beams of charged particles incident on the scintillator; and
   a photonic sensor configured to detect each sub-beam of light corresponding to each incidental sub-beam of charged particles,
   wherein the electron-optical assembly testing system, further comprises a detection data generator configured to generate detection data in dependence on sub-beams of light incident on the photonic sensor.

5. The electron-optical assembly testing system according to claim 1, wherein the sub-beam detector is configured to:
   sense the sub-beams of charged particles incident on the sub-beam detector; and
   generate detection data in dependence on the incident sub-beams of charged particles.

6. The electron-optical assembly testing system according to claim 4, wherein the detection data is suitable for generating one or more images that are indicative of the focus and or deflection states of the sub-beams of charged particles.

7. The electron-optical assembly testing system according claim 1, further comprising one or more computing devices, wherein each computing device is configured to:
   determine the performance of an electron-optical assembly; and/or
   control the test of an electron-optical assembly by the electron-optical assembly testing system.

8. The electron-optical assembly testing system according claim 1, wherein the electron-optical assembly is configured to simultaneously, or individually, manipulate each of a plurality of beams of charged particles.

9. The electron-optical assembly testing system according to claim 1, wherein the electron-optical assembly comprises a stack of layers;
   each layer in the stack comprises one or more substrates; and
   one or more layers in the stack comprises a plurality of MEMS components.

10. The system electron-optical assembly testing according to claim 1, wherein the electron-optical assembly is comprised by an electron-optical device for use in a charged particle apparatus for SEM or lithography.

11. A method of testing an electron-optical assembly, the method comprising:
   while an electron-optical device comprising the electron-optical assembly, is not installed in a charged particle apparatus for SEM or lithography, illuminating the electron-optical assembly with at least one beam of charged particles such that charged particles in the at least one beam are transmitted through the electron-optical assembly in a plurality of sub-beams;
   detecting sub-beams of charged particles that have been transmitted through the electron-optical assembly; and
   determining the performance of the electron-optical assembly in dependence on the detected sub-beams;
   wherein the test of the determination of the performance of the electron-optical assembly is made prior to use of the electron-optical device that comprises the electron-optical assembly, in the charged particle apparatus for SEM or lithography.

12. The method of claim 11, wherein the determining the performing of an electron-optical assembly at a number of stages during the manufacture of the electron-optical assembly.

13. The method of claim 11, wherein the illuminating power of the electron-optical assembly by at least one beam of charged particles is less than the power that the electron-optical device is illuminated with when it is used in the charged particle apparatus for SEM or lithography.

14. The method according to claim 11, wherein detecting sub-beams of charged particles that have been transmitted through the electron-optical assembly comprises either:

generating, by scintillation, a plurality of sub-beams of light that respectively correspond to the sub-beams of charged particles; detecting each of the plurality of sub-beams of light; and generating a detection data signal in dependence on the sub-beams of light; or detecting the sub-beams of charged particles transmitted from the electron-optical assembly; and generating a detection data signal in dependence on the detected sub-beams of charged particles.

15. The method according of claim 14, wherein determining the performance of the electron-optical assembly in dependence on the detected sub-beams comprises determining the performance of the electron-optical assembly in dependence on the detection data signal.

16. The method according to claim 11, wherein the electron-optical assembly is configured to deflect the paths of the sub-beams and/or focus the sub-beams.

17. The method according to claim 16, wherein determining the performance of the electron-optical assembly comprises comparing a determined deflection and/or focus against an expected deflection and/or focus.

18. The method according to claim 11, wherein the electron-optical assembly comprises a stack of layers; each layer in the stack comprises one or more substrates; and one or more layers in the stack comprises a plurality of MEMS components arranged in an array.

19. An electron-optical assembly testing system for testing an electron-optical assembly prior to use of an electron-optical device comprising the electron-optical assembly, in a charged particle apparatus for SEM or lithography, the electron-optical assembly testing system comprising:

a source of charged particles configured to emit a beam of charged particles;

an electron-optical assembly holder configured to hold an electron-optical assembly for testing the electron optical assembly by transmission of charged particle beams from the source through the electron optical assembly, the electron-optical assembly for use in an electron-optical device in a charged particle apparatus for SEM or lithography, wherein the source of charged particles is configured to emit the beam of charged particles at a lower power than a charged particle source in the charged particle apparatus for SEM or lithography; and a sub-beam detector configured to detect sub-beams of charged particles transmitted from the source through the electron-optical assembly held by the holder while the electron-optical device comprising the electron-optical assembly is not installed in the charged particle apparatus for SEM or lithography.

20. The electron-optical assembly testing system according to claim 19, the electron-optical assembly to be tested is at a number of different stages during the manufacture of the electron-optical assembly and/or after the complete manufacture of the electron-optical assembly.

* * * * *